US 6,556,081 B2

(12) United States Patent
Muza

(10) Patent No.: US 6,556,081 B2
(45) Date of Patent: Apr. 29, 2003

(54) SINGLE-ENDED, ULTRA LOW VOLTAGE CLASS AB POWER AMPLIFIER ARCHITECTURE HAVING A COMMON-MODE FEEDBACK QUIESCENT CURRENT CONTROL CIRCUIT

(75) Inventor: John M. Muza, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/994,959

(22) Filed: Nov. 27, 2001

(65) Prior Publication Data

US 2002/0075073 A1 Jun. 20, 2002

Related U.S. Application Data

(60) Provisional application No. 60/255,815, filed on Dec. 15, 2000.

(51) Int. Cl.[7] .................................................. H03F 3/45
(52) U.S. Cl. ........................................ 330/253; 330/258
(58) Field of Search ................................. 330/253, 255, 330/258, 259, 261

(56) References Cited

U.S. PATENT DOCUMENTS

| | | | |
|---|---|---|---|
| 4,737,732 A | | 4/1988 | Westwick |
| 4,853,645 A | | 8/1989 | Seevinck et al. |
| 5,428,316 A | | 6/1995 | Molnar |
| 5,684,432 A | | 11/1997 | Embree |
| 5,689,211 A | | 11/1997 | Embree |
| 5,854,574 A | * | 12/1998 | Singer et al. ................ 330/253 |
| 5,936,466 A | * | 8/1999 | Andoh et al. ................ 330/253 |
| 6,043,706 A | | 3/2000 | Nowak et al. |

OTHER PUBLICATIONS

Huijsing, "Low-Power Low-Voltage VLSI Operational Amplifier Cells", IEEE Transactions onf Circuits and Systems, Nov. 1995, pp. 841–852, vol. 42, No. 11.
De Langen, "Compact Low-Voltage Power-Efficient Operation Amplifier Cells for VLSI", IEEE Journal of Solid-State Circuits, Oct. 1998, pp. 1496, vol. 33, No. 10.

* cited by examiner

*Primary Examiner*—Benny Lee
*Assistant Examiner*—Khanh Van Nguyen
(74) *Attorney, Agent, or Firm*—April M. Mosby; Wade James Brady, III; Frederick J. Tekecky, Jr.

(57) ABSTRACT

A single-ended, ultra low voltage class AB power amplifier (100) including an input gain stage (102), output gain stage (104), a quiescent current control circuit (106) and a output stage bias reference circuit (108). The input gain stage (102) includes differential inputs (IN−, IN+) and differential outputs ($A_1$, $B_1$). The output stage (104), having control transistors, connects to each differential output ($A_1$, $B_1$) of the input stage (102), and a quiescent current control circuit (106) deriving common mode feedback control signal ($V_{CS1}$) from the differential outputs ($A_1$, $B_1$) and voltage bias node ($D_1$). A quiescent current control circuit (106) derives the common mode feedback control signal ($V_{CS1}$) to maintain the voltage of the input gain stage transistors ($M_3$, $M_4$) at a desired level. The quiescent current control circuit (106) uses the bias voltage ($V_{D1}$) supplied by an output stage bias reference (108) coupled thereto for generating the control signal ($V_{CS1}$) to be applied to the gates of the input stage transistors ($M_3$, $M_4$), thereby maintaining the quiescent current of the output transistors ($M_7$, $M_8$) at a desired value.

7 Claims, 5 Drawing Sheets

SINGLE-ENDED, ULTRA LOW VOLTAGE CLASS AB POWER AMPLIFIER ARCHITECTURE HAVING A COMMON-MODE FEEDBACK QUIESCENT CURRENT CONTROL CIRCUIT

CROSS REFERENCE TO RELATED APPLICATIONS

This application claims benefit of 60/255,815 filed Dec. 15, 2000.

FIELD OF THE INVENTION

The present invention relates to a power amplifiers, and, more particularly, to a single-ended, ultra low voltage CMOS class AB power amplifier architecture, having a common-mode feedback quiescent current control circuit.

BACKGROUND OF THE INVENTION

Applying simple topologies in order to obtain high efficiency is the key design technique for future analog cells in mixed-mode very-large-scale integration (VLSI) circuits. As the reduction in feature size of complementary metal-oxide-semiconductor (CMOS) processes continues steadily, supply voltage must be reduced while higher integration density enforces lower power consumption per cell. The low supply voltage complicates the analog cell design, yielding often more complex circuit solutions, which may even result in a performance reduction. The only way for analog cells to keep up with digital performance and supply-voltage reduction is by using very efficient topologies that combine low-voltage operation with high power efficiency and small die area.

Operational amplifiers (Op-amps) must have linear transfer characteristics, stable frequency response, insensitivities to process variations, and very high input impedance to interface with CMOS circuitry.

Existing op-amps can either operate well below 3 V but use a complex structure or employ a simple two stage topology but require a supply voltage of the order of 2.7–3.0 V depending on the technology. In general, power op-amps must be capable of supplying high power to a load coupled thereto at low D.C. bias voltages. Low resistive type loads, such as a speaker having a 4, 6, or 8 Ω impedance, and low voltage power supply, such as those within the range of 1.5–1.8 V present further complicate the design of conventional differential and single-ended op-amps. The low voltage of the power supply imposes one part of the difficulty, while the low resistivity of the load imposes another. To supply the amount of current necessary for a low resistive load, large output transistors are implemented with the conventional op-amp design. The problem that must be addressed, however, is the control of the D.C. quiescent current associated with CMOS amplifiers having large output transistors that introduce large parasitic capacitance. The high load currents and large dimensions of output transistors in a conventional amplifier imply a high sensitivity of quiescent current to process variations and biasing. As a result, small deviations in the gate voltages of output transistors can lead to quiescent currents that greatly exceed desired requirements.

There are many ways to control the quiescent current of an output stage within an amplifier but these may depend upon temperature or different processing parameters. The preference is to set the quiescent current to some fixed current within the micro to milli-amps range.

There are two main categories of output stage quiescent current control in class AB style amplifiers. These are feedforward and feedback. Feedforward styles are less obtrusive to the operation of the main amplifier than feedback styles, but feed forward requires a large voltage headroom to bias all the pertinent transistors correctly. For designs having power supply voltages within the range from 1.5V to 1.8V or below, feed-forward techniques are not acceptable. Feedback styles offer lower voltage capabilities, but generally suffer from some sort of stability issues. At the very least serious transient settling effects exist that could affect the performance of the amplifier.

Thus, there exists a need for an ultra low voltage CMOS class AB power amplifier architecture, having a common-mode feedback quiescent current control circuit. The power amplifier should also have high gain, inherent stability and simplicity of implementation which have proved difficult in the past to achieve.

SUMMARY OF THE INVENTION

To address the above-discussed deficiencies of the power amplifiers having feedforward quiescent current control, the present invention teaches a single-ended, ultra low voltage class AB power amplifier architecture, having a common-mode feedback quiescent current control circuit. A first embodiment of the power amplifier having a differential input and a single output according to the present invention provides a power amplifier comprising an input gain stage having differential inputs and differential outputs, an output gain stage and a quiescent current control circuit. The quiescent current control circuit acts as a high input impedance closed loop common mode feedback to derive a common mode feedback control signal from the differential outputs of the input gain stage to maintain a desired quiescent current within the output gain stage. The output gain stage, connected to the input gain stage, includes a pair of control transistors interfacing with the differential outputs of the input gain stage. The output gain stage provides an output for the power amplifier. An output stage bias reference circuit supplies a bias voltage level such that the common mode control signal supplied to the input gain stage is proportional to the difference between the differential output terminals and the bias voltage level.

The solution for the output stage quiescent current control is a common-mode feedback approach for a single-ended amplifier. Since a common-mode feedback circuit only operates on a common-mode signal, the main differential signal path through the amplifier has maximum integrity.

In an alternative embodiment, an error amplifier is used instead of the common-mode feedback circuit to control the quiescent current at a desired level. Given this embodiment the differential output leads of the input gain stage and the bias reference voltage connect to the error amplifier such that the difference between the average of the differential output voltages and the bias reference voltage set the quiescent current at the desired level.

Another embodiment includes the use of a folded cascode input stage substituting for the simplified input stage.

Advantages of this design include but are not limited to an amplifier that operates at a low voltage having a quiescent current control circuit that is not complex. Using the parasitic capacitance of the output stage transistors, the stability is improved over prior art approaches. Moreover, since the quiescent current control circuit is a common-mode feedback approach rather than a differential, there exists no conflicts in stability when the amplifier swings in voltage between two power supply voltage potentials.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
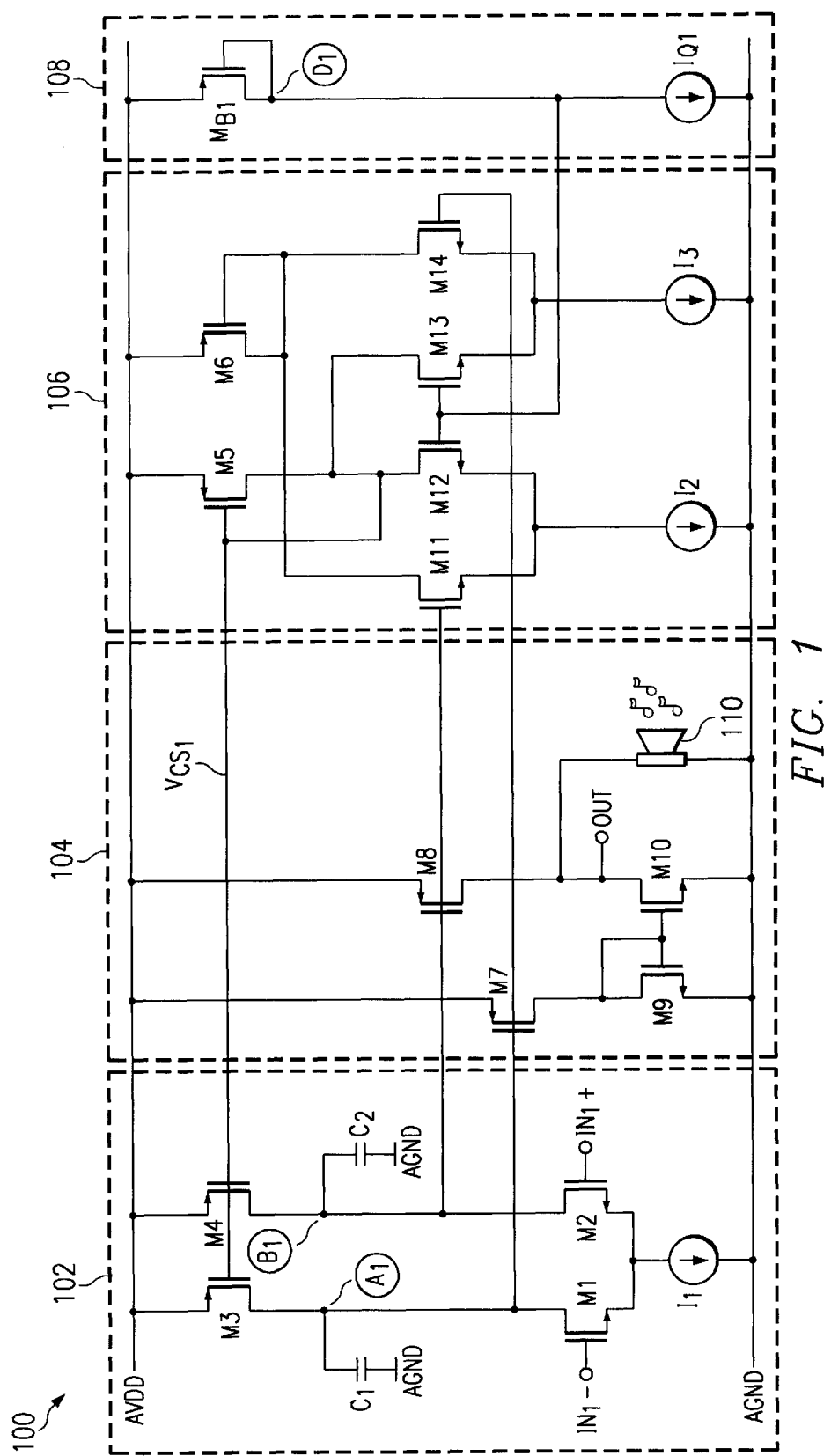
FIG. 1 is a schematic of a first embodiment of a class AB amplifier in accordance with the present invention.

FIG. 1 illustrates an amplifier circuit 100 utilizing the new quiescent current control technique in accordance with the present invention. The solution presented here can be thought of as a common-mode feedback approach for a single-ended amplifier. Since a common-mode feedback circuit only operates on a common-mode signal, the main differential signal path through the amplifier has maximum integrity. Amplifier circuit 100 includes an input stage 102, output stage 104, common-mode type feedback quiescent current control circuit 106 and an output stage bias reference circuit 108. Input stage 102 includes transistors $M_1$, $M_2$, $M_3$ and $M_4$ connected as a fully differential pair having differential inputs and differential outputs. The input stage acts as a gain stage. The output load of input stage 102 includes the output impedance seen from nodes $A_1$ and $B_1$ to an AC ground, which includes the impedance of transistor $M_3$ in parallel with the impedance of transistor $M_1$ and the impedance of transistor M4 in parallel with the impedance of transistor M2, respectively. Voltages $V_A$ and $V_B$ at nodes $A_1$ and $B_1$ are frequency compensated by capacitors $C_1$ and $C_2$, since the amplifier output pole correlates to a relatively high frequency due to the low impedance load. This circuit includes only one dominant pole relative to voltages $V_{A1}$, and $V_{B1}$ at nodes $A_1$ and $B_1$. Thus, the only compensation needed includes two capacitors, $C_1$ and $C_2$, to analog ground. This architecture is suitable for very low power supply voltages, such as 1.5V in a digital CMOS process.

There is an input differential voltage which transistors $M_1$ and $M_2$ translate to a differential current which flows through the first leg including transistors $M_1$ and $M_3$ and the second leg including transistors $M_2$ and $M_4$. The impedance at nodes $A_1$ and $B_1$ provides a voltage appropriate for a high gain stage. The voltages $V_{A1}$ and $V_{B1}$ will drive transistors $M_7$ and $M_8$ of output stage 104, setting the amount of current provided to flow through transistors $M_7$ and $M_8$. Thus, if voltages $V_{A1}$ and $V_{B1}$ decrease, more current would flow through transistors $M_7$ and $M_8$. The voltage at nodes $V_A$ and $V_B$ are 180° out of phase with each other. Accordingly, when one rises the other falls. Thus, if node $V_{B1}$ rises, driving the gate of transistor $M_8$, then the drain voltage of transistor $M_8$ will be 180° out of phase with node $B_1$; thereby, falling. In the other path, where the voltage at node $A_1$ falls (since the voltage at node $B_1$ is rising), the drain voltage of transistor $M_7$ rises. Current flowing through transistor $M_7$ is mirrored into transistor $M_{10}$, which is connected in series with transistor $M_8$. There exists an inversion across the gate to drain of transistor $M_{10}$ such that the drain of $M_{10}$ is falling. Transistors $M_9$ and $M_{10}$ form a current mirror in output stage 104, providing current to the output node OUT of the single-ended power amplifier 100. The output OUT is applied to a load which in this case is a speaker 110. Thus, the output stage 106 in an amplifier 100 in accordance with the present invention is a current handling stage such that it is capable of flowing large amounts of current to low impedance loads. If the load OUT is a speaker 110, for example, the output stage would have to supply hundreds of milli-amps of current. The input stage 102, however, will supply 10 micro-amps which represents many orders of magnitude difference.

Transistors $M_7$ and $M_8$ have a large parasitic gate to source capacitance due to their large area which enable them to large supply currents. In the architectural sense, the parasitic capacitance of transistors $M_7$ and $M_8$ can be a hindrance to stability. Yet, the compensation capacitors $C_1$ and $C_2$, added to nodes $A_1$ and $B_1$, add in parallel to the parasitic capacitance of transistors $M_7$ and $M_8$. Thus, the topology works towards stabilizing the amplifier.

The common-mode type feedback quiescent current control circuit 106 includes transistors $M_5$, $M_6$, $M_{11}$, $M_{12}$, $M_{13}$, $M_{14}$ and constant current sources $I_2$ and $I_3$. Current through nodes $A_1$ and $B_1$ drive the gates of transistors $M_{11}$ and $M_{14}$. Transistors $M_{11}$ and $M_{12}$ coupled to form a first differential gain stage. Transistors $M_{13}$ and $M_{14}$ coupled to form a second differential gain stage. Transistors $M_5$ and $M_6$ couple to form a diode connected load for the combined first and second differential gain stage. Output stage bias reference 108 includes a diode coupled transistor $M_{B1}$ connected in series with a constant current source $I_{Q1}$. The common-mode type feedback quiescent control circuit 106 evaluates the voltage at nodes $A_1$ and $B_1$ and compares it against the predetermined current that flows through transistor $M_B$ at node $D_1$. The average of the voltage at nodes $A_1$ and $B_1$ will be set to the gate voltage $V_{D1}$ of transistor $M_B$, which when applied to the gates of transistor $M_3$ and $M_4$ maintain the quiescent current at a predetermined value.

More particularly, transistors $M_{11}$, $M_{12}$, $M_{13}$ and $M_{14}$ act like two differential pairs, where the inputs are voltages $V_{A1}$, $V_{B1}$ and $V_{D1}$. If voltages $V_{A1}$ and $V_{B1}$ are too high or close to the power supply rail voltage, then the gates of transistor $M_{11}$ and $M_{14}$ will be too high. If the gate of transistor $M_{11}$ is higher than voltage $V_{D1}$ then more current will flow through transistors $M_{11}$ than transistor $M_{12}$, when normally the current would have split evenly. Less current through transistor $M_{12}$ means less current through transistor $M_5$ which means transistor $M_5$ would have a small gate-to-source voltage; thus the gate of transistor $M_5$ connected to the gates of transistors $M_3$ and $M_4$ would must rise. But the rising of the voltages at gates of transistors $M_3$ and $M_4$, lead to the falling of the voltage at nodes $A_1$ and $B_1$ due to inversion of the gate-to-drain of transistors $M_3$ and $M_4$. Thus, circuit 106 regulates nodes $A_1$ and $B_1$ up and down, accordingly.

This type of feedback is known as common-mode feedback, since the feedback is activated by the common-mode voltage changes at $V_{A1}$–$V_{B1}$. Common-mode type feedback circuits are generally used to set the common-mode output voltage for a fully differential amplifier, since a common-mode signal and a differential signal are necessary in these types of amplifiers.

In the present case, however, power amplifier 100 is a single-ended amplifier which does not need a voltage common-mode amplifier. There still exists a need to control the quiescent current, hence circuit 106 sets the DC level of the output of circuit 102, a sine wave for example, which will swing positive or negative around the fixed DC level. Thus, the application of circuit 106 within amplifier 100 is used solely to produce a quiescent current control signal through transistor $M_5$; thereby producing a different result than conventional common-mode feedback circuits.

Specifically, the gate of transistors $M_3$ and $M_4$ tied to a predetermined voltage behave like current sources that flow through transistors $M_1$ and $M_2$. Since nodes $A_1$ and $B_1$ are high gain impedance nodes, if there is any small processing error for any of the transistors $M_1$–$M_4$, nodes $A_1$ and $B_1$ will be out of control. In addition, if, for example both nodes $A_1$ and $B_1$ sit at one half the supply voltage AVDD and an error existed in the input stage 102 on the order of 1 $\mu$V, due to the high gain of stage 102, the voltages $V_{A1}$ and $V_{B1}$ at these nodes would ideally reach the supply voltage AVDD and amplifier 100 would cease to function. Thus, there is a need for a control to set voltages $V_{A1}$ and $V_{B1}$ where it is beneficial, even if the voltages $V_{A1}$ and $V_{B1}$ are set to voltage $V_{D1}$, which is the desirable voltage.

This architecture uses the fact that this amplifier will be driving a low impedance speaker, typically 32 Ω or less. Thus, this approach takes advantage of the frequency location of the load pole, a common example is 32 Ω and 200 pF which yields approximately 24.8 MHz pole. This is a high frequency as compared to the amplifier's designed bandwidth.

Figure 2:
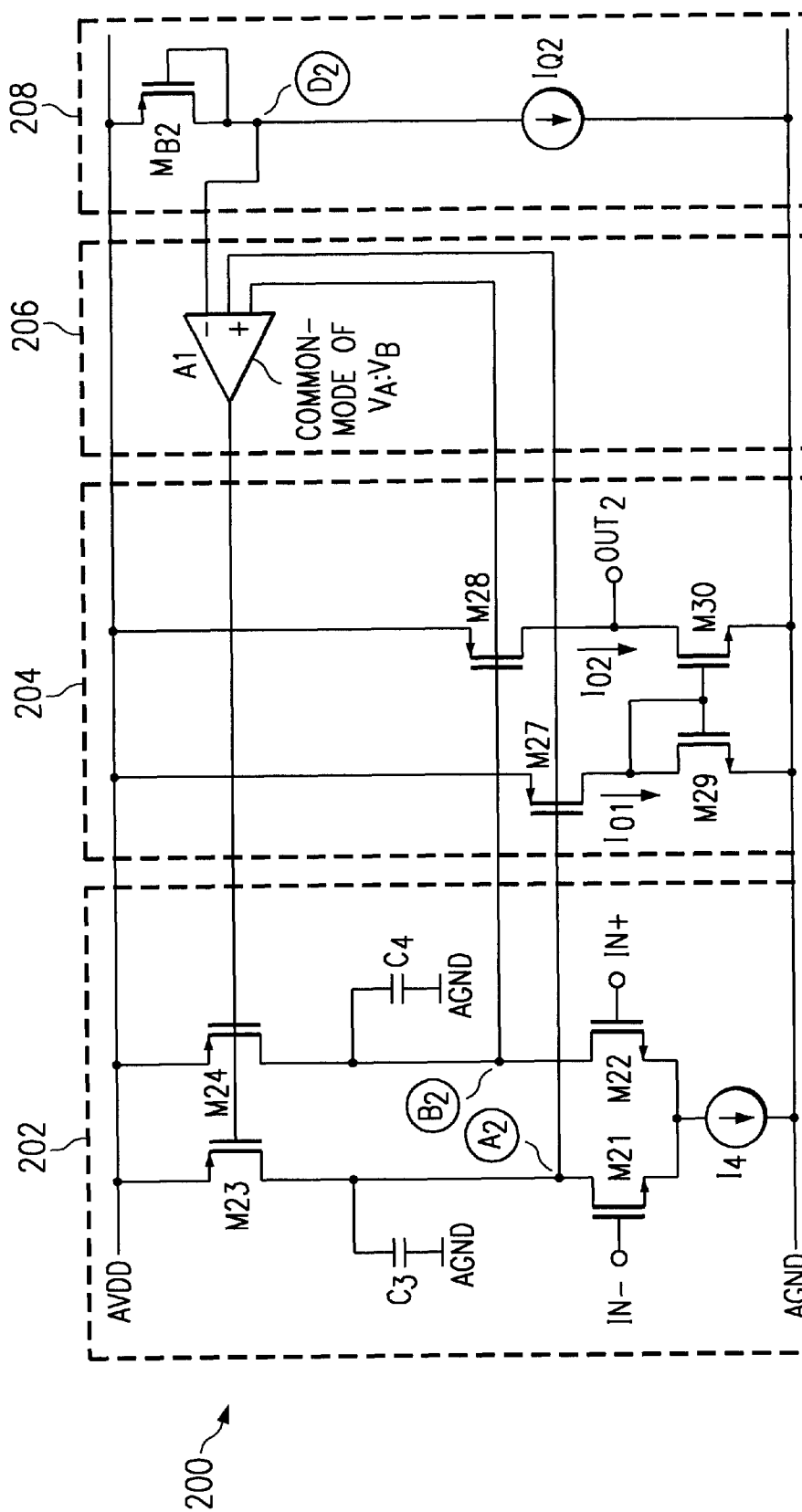
FIG. 2 is a schematic of a second embodiment of a class AB amplifier in accordance with the present invention.

FIG. 2 represents yet another embodiment of an amplifier 200 in accordance with the present invention. Amplifier circuit 200 includes an input stage 202, output stage 204, common-mode type feedback quiescent current control circuit 206 and an output stage bias reference circuit 208. Input stage 202 includes transistors $M_{21}$, $M_{22}$, $M_{23}$ and $M_{24}$ connected as a fully differential pair having differential inputs and differential outputs. The input stage 202 acts as a gain stage similar to that of input stage 102 of FIG. 1. Output stage 204 includes transistors $M_{27}$, $M_{28}$, $M_{29}$ and $M_{30}$ configured similar to the output stage 104 of FIG. 1. Error amplifier $A_1$ substitutes for the common-mode feedback quiescent control circuit 106 of FIG. 1. This amplifier $A_1$, a low gain amplifier, controls the gain of transistors $M_{23}$ and $M_{24}$. Output stage bias reference 208 remains the same as the previous embodiment 100 where output stage bias reference 208 includes a diode coupled transistor $M_{B2}$ connected in series with a constant current source $I_{Q2}$. Given inputs from nodes $A_2$, $B_2$ and $D_2$, to the amplifier $A_1$ circuit 106 regulates nodes $A_2$ and $B_2$ up and down accordingly. Thus, if voltages $V_{A2}$ and $V_{B2}$ are too high or close to the power supply rail voltage, then the output of amplifier $A_1$ will supply a larger voltage to the gates of transistors $M_{23}$ and $M_{24}$; leading to the falling of the voltage at nodes $A_2$ and $B_2$ due to inversion of the gate-to-drain of transistors $M_{23}$ and $M_{24}$.

More particularly, amplifier $A_1$ forms a feedback loop with input stage 202. This feedback scheme is operating on the common-mode level of $V_{A2}$ and $V_{B2}$. Thus if $V_{A2}$ increase and $V_{B2}$ decreases in voltage in response to a differential input, the quiescent current control loop including amplifier $A_1$ would not respond because it is looking at the average value of the two nodes $V_{A2}$ and $V_{B2}$.

Amplifier A1 is a low gain, wideband amplifier which forces the common-mode voltage which represents the average of the two nodes $V_{A2}$ and $V_{B2}$ [$(V_{A2}+V_{B2})/2$] to be equal to the voltage $V_{D2}$ at node $D_2$. The current $I_{Q2}$ through $M_{B2}$ is a constant. It is the reference current that the output stage's quiescent current is compared to and derived from. At quiescent conditions, voltages $V_A$ and $V_B$ will be approximately equal to one another. Thus, the feedback loop comprising transistors $M_3$, $M_4$, and amplifier $A_1$ forces $V_{A2} \cong V_{B2} \cong V_{D2}$. Transistors $M_7$ and $M_8$ may be scaled (matched) copies of transistor $M_{B2}$, so that the feedback loop is forcing the voltage $V_{sg}$ of transistors $M_{27}$ and $M_{28}$ to a predetermined value. The output stage current $I_{O2}$ will be an integer multiple of the $I_Q$ current source. The channel-length modulation effect which under typical conditions will cause a small error in $I_{O2}$ relative to $I_{Q2}$.

Both single-ended amplifiers 100 and 200 assume a low resistive, speaker type load connected to output $OUT_2$ to achieve proper frequency stability. Yields a very low power supply compatible class AB style output stage. The core idea is to use a common-mode type feedback circuit within a single ended amplifier structure for the purpose of controlling the quiescent current in a class AB, ultra-low power supply compatible output stage.

A PMOS input folded type input stage would be the preferred implementation due to its superior voltage swing on nodes $A_2$ and $B_2$. This would improve the power amplifier gate drive to the power FETS.

Figure 3A:
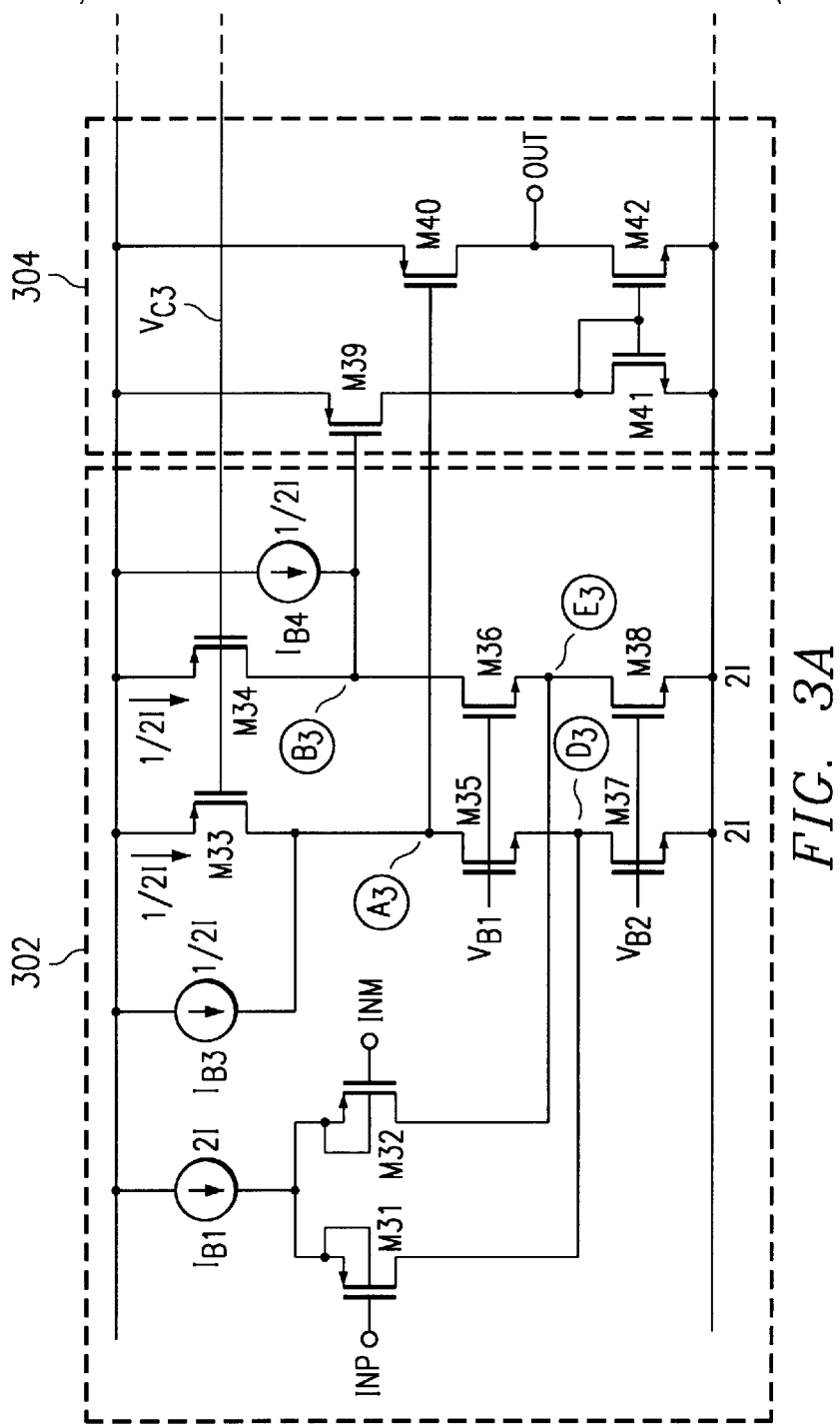
FIGS. 3(A,B) is a schematic of a third embodiment of a class AB amplifier in accordance with the present invention.
Figure 3B:
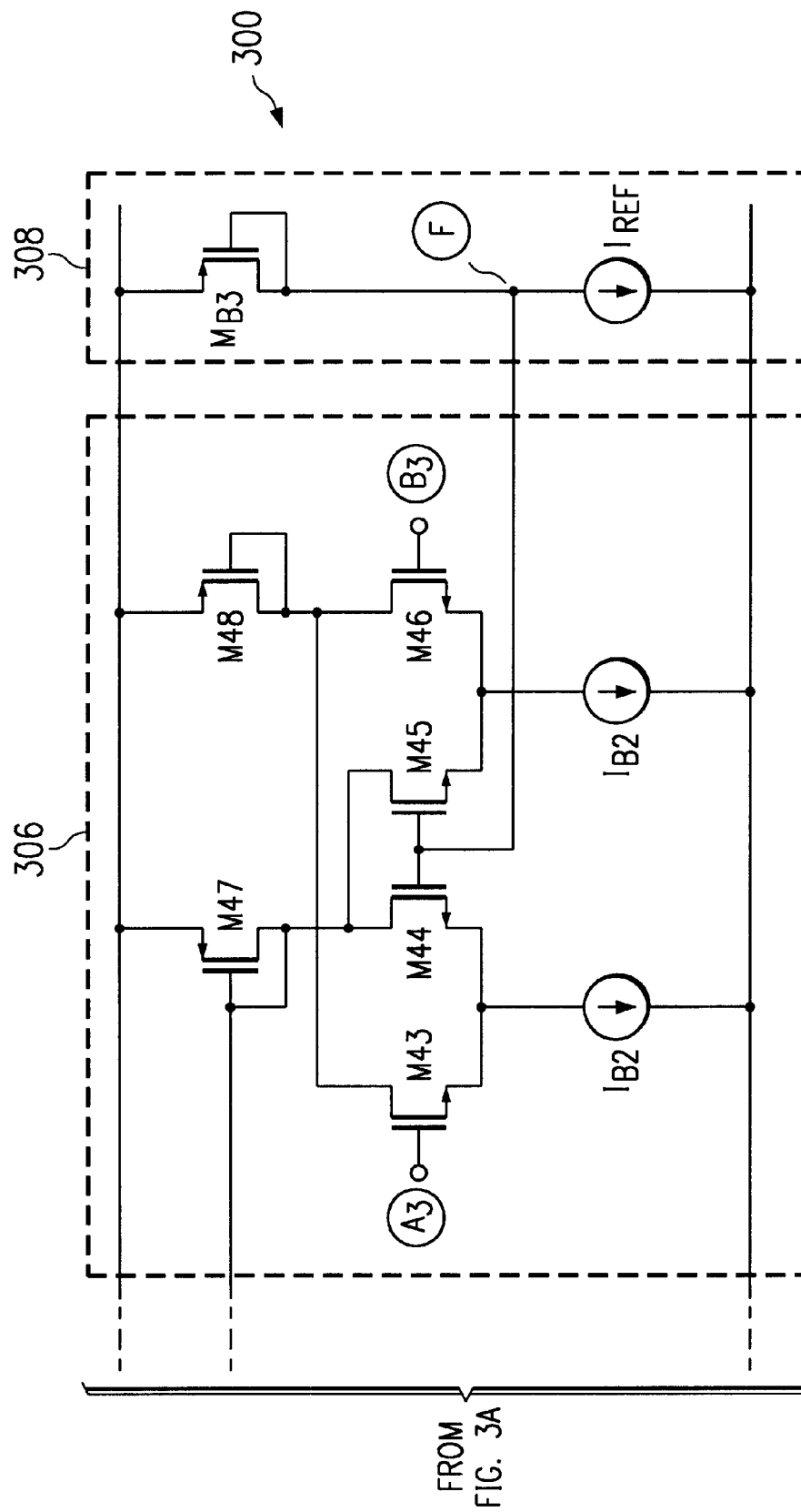

FIG. 3 illustrates a third embodiment 300 that embodies the principles of the previous two embodiments; yet, substitutes a folded cascode input stage 302. Amplifier 300 includes an input stage 302, output stage 304, common-mode feedback quiescent current control circuit 306 and an output stage bias reference circuit 306. In input stage 302, there exists a voltage difference on the gates of transistors $M_{31}$ and $M_{32}$ that changes the current that flows through $M_{37}$ and $M_{38}$ which feed into legs at nodes $D_3$ and $E_3$. These currents are a plus and minus change of current at nodes $A_3$ and $B_3$ which is translated by the gain $G_m$ of the input stage 302. Accordingly, these nodes exhibit a high impedance. As a result, there is a small current change across a very large impedance. Voltage $V_{CS}$ is dynamically controlled by common-mode quiescent current control circuit 306. Thus, the gates of transistors $M_{33}$ and $M_{34}$ of the folded cascode structure 302 set the current through the output stage transistors $M_{39}$ and $M_{40}$. Cascoded transistors $M_{37}$ and $M_{38}$ serve to increase the gain of the input stage 302.

Constant current sources $I_{B3}$ and $I_{B4}$ enable nodes $A_3$ and $B_3$ to can have large voltage swings. Without these current sources $I_{B3}$ and $I_{B4}$, the common-mode feedback type circuit 306 would keep the average voltage between nodes $A_3$ and $B_3$ equal to the reference voltage [$(V_{A3}+V_{B3})/2=V_{REF}$]; but, since voltage $V_{REF}$ is naturally closer to the power supply, voltages $V_{A3}$ and $V_{B3}$ will have asymmetrical swings. Accordingly, the gates drive voltage for transistors $M_{39}$ and $M_{40}$ would be reduced without constant current sources $I_{B3}$ and $I_{B4}$.

The current at nodes $D_3$ and $E_3$ equals the sum of the currents through input transistors $M_{31}$ and $M_{32}$ and the current source transistors $M_{37}$ and $M_{38}$. The folded cascode input stage 302 provides a much larger voltage potential at nodes $A_3$ and $B_3$ than the input stage 102 of FIG. 1 provides at nodes $A_1$ and $B_1$. Thus, the voltage at nodes $A_3$ and $B_3$ can swing further down than the simple counterpart input stage 102. Thus, transistors $M_{39}$ and $M_{40}$ in the output stage 304 of FIG. 3 do not have to be as large as those of FIGS. 1 or 2.

Current sources $I_{B3}$ and $I_{B4}$ provide current at nodes $A_3$ and $B_3$, respectively along with current through transistors $M_{33}$ and $M_{34}$. Thus, the current present at nodes $A_3$ and $B_3$ include static current from current sources $I_{B3}$ and $I_{B4}$ and dynamic current through transistors $M_{33}$ and $M_{34}$. This results in a larger voltage swing at nodes $A_3$ and $B_3$.

An alternative embodiment may include capacitances tied between nodes $A_3$ and $B_3$ and ground as in FIG. 1. Depending upon the size of the parasitic capacitances of transistors $M_{39}$ and $M_{40}$, however, capacitances may not be needed.

Figure 4:
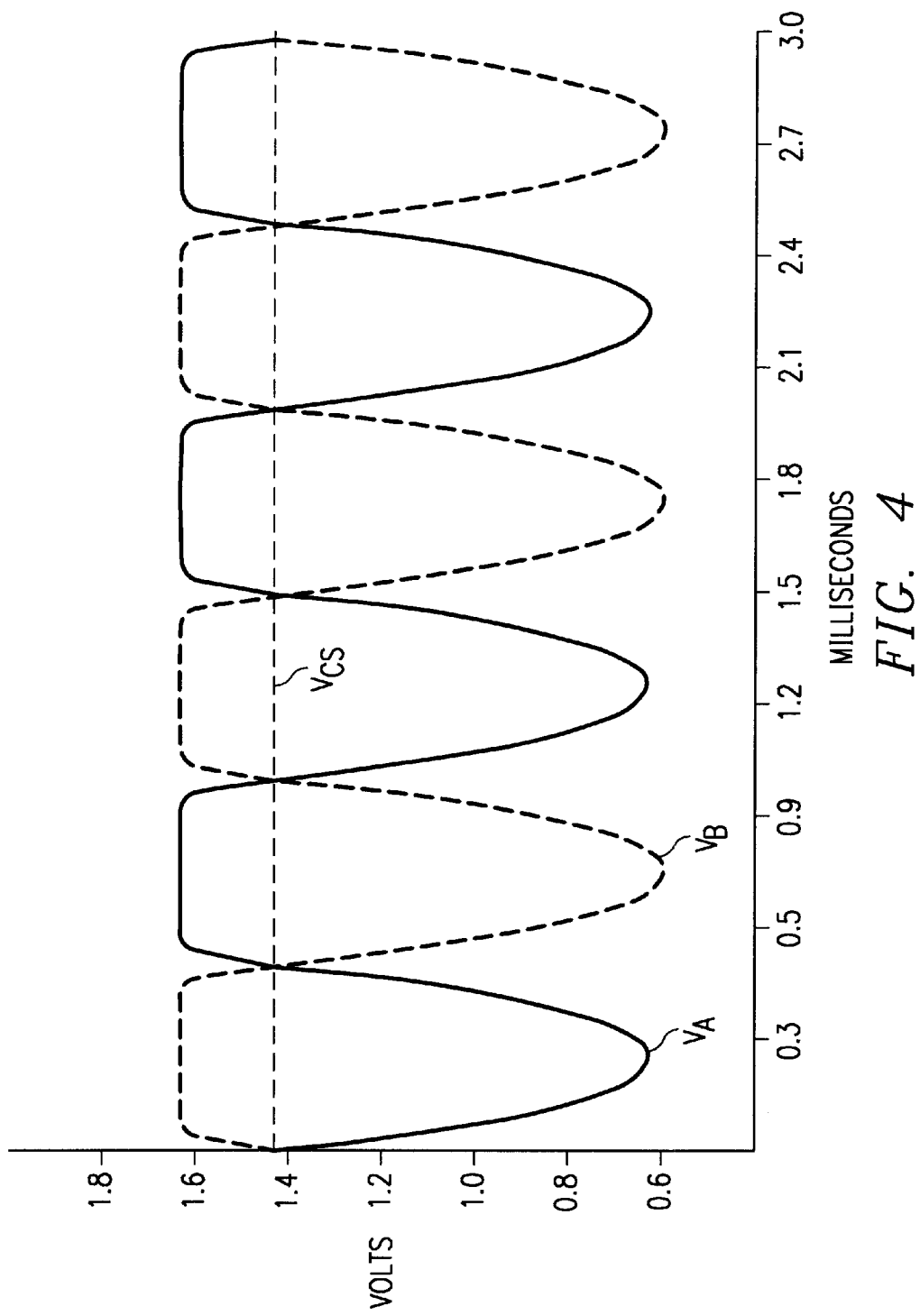
FIG. 4 displays the differential output voltages of the input stage with respect to time given an input sine wave applied to the amplifier.

In FIG. 4 displays voltages $V_{A3}$ and $V_{B3}$ at nodes $A_3$ and $B_3$, respectively, with respect to time. A high gate drive to output FETS, $M_{39}$ and $M_{40}$, exists. Voltage $V_{CS}$, as displayed, provides a reference for voltages $V_{A3}$ and $V_{B3}$. As illustrated, since nodes $A_3$ and $B_3$ sit at quiescent at a relatively high voltage, there is less change in voltage need to progress towards the positive rail AVDD than to the negative rail AGND. Thus, if node $A_3$ goes high and node $B_3$ goes low, when node $A_3$ rises approximately to a voltage that is equivalent to the power supply rail AVDD, node $B_3$ will be limited a relative change decreasing in voltage. As a result, current sources $I_{B3}$ and $I_{B4}$ provide enough current for node $B_3$ allowing a large change in voltage. In the alternative, when node $B_3$ falls near the voltage of the negative power rail AGND, transistors $M_{39}$, $M_{41}$, and $M_{42}$ drives more current.

Given a 1K Hz sine wave input, voltages $V_{A3}$ and $V_{B3}$ at nodes $A_3$ and $B_3$, respectively, drive gates of transistors $M_{39}$ and $M_{40}$ to provide current to the load in the appropriate polarity. The average quiescent control signal $V_{CS}$ approximately 1.45 V, however, will not be altered. Without current sources $I_{B3}$ and $I_{B4}$, the pattern representing the voltage $V_{B3}$ at node $B_3$ would be clipped in the negative half of the sine-wave similar to the positive half. Therefore, by adding the current sources $I_{B3}$ and $I_{B4}$, additional negative voltage swing of 0.5 V as shown is achieved at nodes $A_3$ and $B_3$.

The advantages include but are not limited to a fast, power efficient architecture whereby the use of the parasitic capacitance of transistors $M_{39}$ and $M_{40}$ are the compensation as opposed to adding capacitors like those of input stage 102 of FIG. 1. This architecture is a novel very low power supply simple class AB CMOS power amplifier that is simple to implement and uses minimum silicon chip area.

The present invention finds application in power amplifiers, digital audio equipment, switch-mode power supplies and motor control drives.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A power amplifier, having a power supply rail and ground, comprising:

an input gain stage having a non-inverting input terminal, an inverting input terminal, a control signal input terminal, and a pair of differential output terminals, the input stage in electrical connection with a negative source voltage at the inverting input terminal and a positive source voltage at the non-inverting input terminal;

an output gain stage having an output terminal and a pair of control transistors, each operably connected to one of the pair of differential output terminals;

a quiescent current control circuit, having a bias reference input terminal, the quiescent current control circuit coupled to receive voltage from the differential output terminals of the input stage to derive a common mode feedback control signal from the differential output terminals to maintain a desired quiescent current in the output stage; and an output stage bias reference circuit coupled to the bias reference input terminal of the quiescent current control circuit for supplying a bias voltage level such that the common mode control signal supplied to the input stage is proportional to the difference between the differential output terminals and the bias voltage level.

2. The amplifier as recited in claim 1, wherein the input stage includes a pair of MOS control transistors, each having a gate, a drain and a source, the drain of the pair of MOS control transistors coupled to the positive power supply, the gate of the pair of MOS control transistors coupled together;

a pair of capacitors coupled between the source of the pair of MOS control transistors and ground;

a pair of differential MOS transistors, each having a gate, a drain, and a source, the gate of the first differential MOS transistor coupled to the non-inverting terminal, the gate of the second differential MOS transistor coupled to the inverting terminal, the source of each differential MOS transistor coupled to a respective source of the pair of MOS control transistors; and a constant current source coupled to the drain of each of the differential MOS transistors.

3. The amplifier as recited in claim 1, wherein the input stage is a folded cascode including a pair of MOS control transistors, each having a gate, a drain and a source, the drain of the pair of MOS control transistors coupled to the positive power supply, the gates of the pair of MOS control transistors coupled together;

a first and second constant current source coupled between the positive power supply rail and source of each respective one of the pair of MOS control transistors;

a first pair of differential MOS transistors, each having a gate, a drain, and a source, the gates of the first pair differential MOS transistor coupled together and to the a first bias voltage terminal, the source of each of the first pair of differential MOS transistor coupled to a respective source of the pair of MOS control transistors;

a second pair of differential MOS transistors, each having a gate, a drain, and a source, the gates of the second pair differential MOS transistor coupled together and to a second bias voltage terminal, the source of each of the second pair of differential MOS transistor coupled to a respective drain of the first pair of differential MOS transistors, the drains of the second pair of differential MOS transistors coupled to ground;

a third constant current source coupled to the positive power supply rail; and a pair of input MOS transistors, each having a gate, a drain, and a source, the drains of the input MOS transistors coupled to the third constant current source, the gate of the first input MOS transistor coupled to the non-inverting terminal, the gate of the second input MOS transistor coupled to the inverting terminal, the source of each input MOS transistor coupled to a respective source of the second pair of differential MOS transistors.

4. The amplifier as recited in claim 1, wherein the output stage includes
   a pair of MOS control transistors, each having a gate, a drain and a source, the drains of the pair of MOS control transistors coupled to the positive power supply, the gates of the pair of MOS control transistors each coupled to the respective differential output of the input stage; and a current mirror having a third and a fourth transistor, each transistor having a gate, a drain and a source, the gates of the third and fourth transistor coupled together, the source of the third transistor coupled to the source of the first MOS control transistor and to the gate of the third transistor, the source of the fourth transistor coupled to the source of the second MOS control transistor to form the output terminal, the drains of the third and fourth transistors coupled to ground.

5. The amplifier as recited in claim 1, wherein the quiescent current control circuit is an error amplifier.

6. The amplifier as recited in claim 1, wherein the quiescent current control circuit includes:
   a first differential pair of MOS transistors including a first and a second transistor, each having a gate, a drain and a source, the drains of each of the first differential pair coupled together, the gate of the first transistor coupled to the first differential output terminal of the input stage;

a first constant current source coupled between the drains of the first differential pair of MOS transistors to ground;

a second differential pair of MOS transistors including a third and a fourth transistor, each having a gate, a drain and a source, the drains of each of the second differential pair coupled together, the gate of the third transistor coupled to the second differential output terminal of the input stage to form the bias reference input terminal, the gates of the second and fourth transistors coupled together;

a second constant current source coupled between the drains of the second differential pair of MOS transistors to ground;

a third differential pair of MOS transistors including a fifth and sixth transistor, each having a gate, a drain and a source, the drains of each of the third differential pair coupled to the positive power supply rail, the gate and source of the fifth transistor coupled to the sources of the second and third transistor, the gate and source of the sixth transistor coupled to the sources of the first and fourth transistor, the gate of the fifth transistor coupled to the control signal input terminal of the input stage to provide the common mode control signal.

7. The amplifier as recited in claim 1, wherein the output stage bias reference circuit includes:
   a first MOS transistor, having a gate, a drain and a source, the drain coupled to the positive power supply rail, the gate of the first MOS transistor coupled to the source of the first MOS transistor, the source coupled to the bias reference input terminal of the quiescent current control circuit to provide the reference bias level; and a first constant current source coupled between the source of the first MOS transistor and ground.

* * * * *